United States Patent [19]

Garachtchenko et al.

[11] Patent Number: 5,963,097

[45] Date of Patent: Oct. 5, 1999

[54] LOW-NOISE AMPLIFIER

[76] Inventors: Alexander Viktorovich Garachtchenko, 2011 California St., Apt. 10A, Mountain View, Calif. 94040; Samuel Suresh Martin, 38 Harrison Ave., Gillette, N.J. 07933

[21] Appl. No.: 09/014,325

[22] Filed: Jan. 27, 1998

[51] Int. Cl.[6] ............................... H03F 3/04; H03F 3/16; H03F 3/45
[52] U.S. Cl. ........................... 330/310; 330/300; 330/253
[58] Field of Search ................................... 330/311, 310, 330/300, 3, 252, 253

[56] References Cited

U.S. PATENT DOCUMENTS

| 4,578,647 | 3/1986 | Sasamura | 330/253 |
| 4,801,893 | 1/1989 | Perandi . | |
| 5,047,665 | 9/1991 | Burt | 307/355 |

OTHER PUBLICATIONS

W. T. Holman and J. A. Connelly, "A Compact Low Noise Operational Amplifier for a 1.2 μm Digital CMOS Technology", IEEE Journal of Solid State Circuits, vol. 30 No. 6 Jun. 1995.
W. T. Holman and J. A. Connelly, "A Pseudo–BiCMOS High Gain–Bandwidth Low Noise Operational Amplifier Using a Darlington Input Stage", IEEE Symposium on Circuits and Systems, Apr. 30–May 3, 1995.

Primary Examiner—Robert Pascal
Assistant Examiner—Patricia T. Nguyen

[57] ABSTRACT

A low-noise amplifier is disclosed that is capable of amplifying a signal with high gain (e.g., >60 dB) and low noise (e.g., <2 nV/Hz$^{-\frac{1}{2}}$) over a large frequency bandwidth (e.g., from 1 Hz to 1 MHz) and with a high input impedance (e.g., >$10^6$ Ω), high common mode rejection and high immunity to external noise sources. An illustrative embodiment of the present invention comprises: a first field-effect transistor having a first lead, a second lead and a third lead; a second field-effect transistor having a first lead, a second lead and a third lead, wherein the first lead of the first field-effect transistor is electrically connected to the first lead of the second field-effect transistor, the second lead of the first field-effect transistor is electrically connected to the second lead of the second field-effect transistor, and the third lead of the first field-effect transistor is electrically connected to the third lead of the second field-effect transistor; and a first bipolar junction transistor having a first lead, a second lead and a third lead, wherein the first lead of the first bipolar junction transistor is electrically connected to the first lead of the first field-effect transistor.

7 Claims, 2 Drawing Sheets

LOW-NOISE AMPLIFIER

FIELD OF THE INVENTION

The present invention relates to electronics in general, and, more particularly, to a low-noise amplifier.

BACKGROUND OF THE INVENTION

Typically, the performance of an electronic system is limited by the noise emitted by the system's components. For example, the performance of a wireless telecommunications terminal is typically limited by the quantity of phase noise produced by its oscillator.

Although a crystal oscillator typically emits little phase noise, it cannot be easily fabricated as a component of an integrated circuit. In contrast, an oscillator that is fabricated from semiconductor devices in an integrated circuit typically emits more phase noise than does a crystal oscillator.

Although there are several types of noise emitted by a semiconductor device (e.g., thermal noise, shot noise, flicker noise, etc.), empirically, the largest contributing factor to phase noise in a circuit is flicker noise, which is also known as "1/f" noise because the output current noise spectral density of the device varies inversely with frequency.

Empirically, the quantity of flicker noise emitted by a device is affected by the process that is used to fabricate the device. Therefore, a semiconductor manufacturer can affect the quantity of flicker noise emitted by the devices it fabricates by carefully measuring the flicker noise emitted by the devices emanating from a fabrication line and thereafter modifying the fabrication line process in response to the measured results.

Typically, the magnitude of the noise emitted by a device is too small to be directly observed by a noise measurement apparatus, such as a spectrum analyzer, and, therefore, the noise is amplified by an amplifier prior to analysis by the noise measurement apparatus. In most cases, however, the magnitude of the noise emitted by the device under test is small in comparison to the noise emitted by a typical amplifier, and, therefore, it is paramount that the amplification is performed in such a manner that the noise emitted by the device is not engulfed by the noise emitted by the amplifier. Therefore, the amplifier must itself emit very little noise.

FIG. 1 depicts a schematic diagram of a two-stage, low-noise amplifier that is well-known in the prior art. The first stage comprises bipolar junction transistor 101 and the second stage comprises field-effect transistor 102, interconnected as shown. As is well-known in the prior art, a two-stage amplifier comprising a bipolar junction transistor and a field-effect transistor has the same gain regardless of which transistor is used in either stage. For example, the overall gain of a two-stage amplifier, G, is related to the gain of the first stage, $G_1$, and the gain of the second stage, $G_2$, by the function:

$$G = G_1 + G_2 \quad \text{(Eq. 1)}$$

Yet Friis' formula, which relates the noise emitted by a two-stage amplifier to the noise emitted by each stage, suggests that the first stage should comprise the bipolar junction transistor and the second stage should comprise the field-effect transistor. For example, the noise factor of a two-stage amplifier, F, is related to the noise factor of the first stage, $F_1$, and the noise factor of the second stage, $F_2$, by Friis' formula:

$$F = F_1 + \frac{F_2 - 1}{G_1} \quad \text{(Eq. 2)}$$

which clearly indicates that the noisier device should be used in the second stage. Because it is well-known in the prior art that field-effect transistors are noisier devices that bipolar junction transistors, Friis' formula suggests that the first stage should comprise the bipolar junction transistor and the second stage should comprise the field-effect transistor.

The amplification of extremely small signals, such as flicker noise, requires an amplifier with high gain, a large bandwidth, low noise, high input impedance, high common mode rejection and immunity to external noise sources. So although the amplifier depicted in FIG. 1 is characterized by high gain and a large bandwidth, it does not have a high input impedance. The high input impedance can be achieved with a field-effect transistor in the first stage and the high gain can be achieved with a bipolar junction transistor in the second stage, but Friis' formula, as discussed above, suggests that such an arrangement will unnecessarily introduce noise into the signal.

Therefore, the need exists for an amplifier that has low noise, high gain, a large bandwidth, high input impedance, high common mode rejection and immunity to external noise sources.

SUMMARY OF THE INVENTION

Some embodiments of the present invention are capable of amplifying a signal without some of the costs and disadvantages of techniques in the prior art. In particular, some embodiments of the present invention are able to amplify a signal with high gain (e.g., >60 dB) and low noise (e.g., <2 nV/Hz$^{-\frac{1}{2}}$) over a large bandwidth (e.g., from 1 Hz to 1 MHz) with a high input impedance (e.g., >$10^6$ Ω), high common mode rejection and high immunity to external noise sources. Such embodiments are particularly useful for amplifying the noise emitted by a single semiconductor device.

An illustrative embodiment of the present invention comprises: a first field-effect transistor having a first lead, a second lead and a third lead; a second field-effect transistor having a first lead, a second lead and a third lead, wherein the first lead of the first field-effect transistor is electrically connected to the first lead of the second field-effect transistor, the second lead of the first field-effect transistor is electrically connected to the second lead of the second field-effect transistor, and the third lead of the first field-effect transistor is electrically connected to the third lead of the second field-effect transistor; and a first bipolar junction transistor having a first lead, a second lead and a third lead, wherein the first lead of the first bipolar junction transistor is electrically connected to the first lead of the first field-effect transistor.

DETAILED DESCRIPTION

Figure 1:
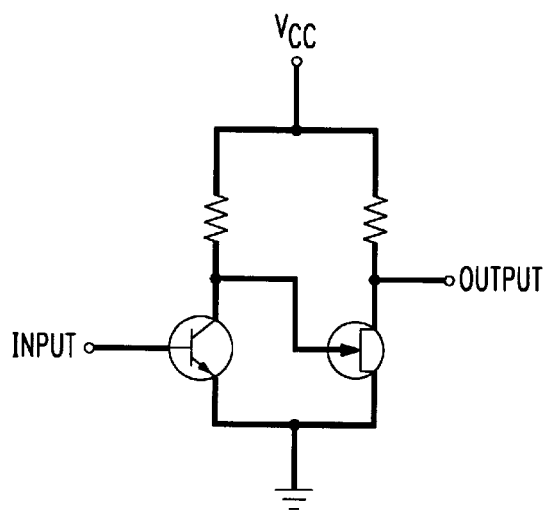
FIG. 1 depicts a schematic diagram of a two-stage amplifier in the prior art.
Figure 2:
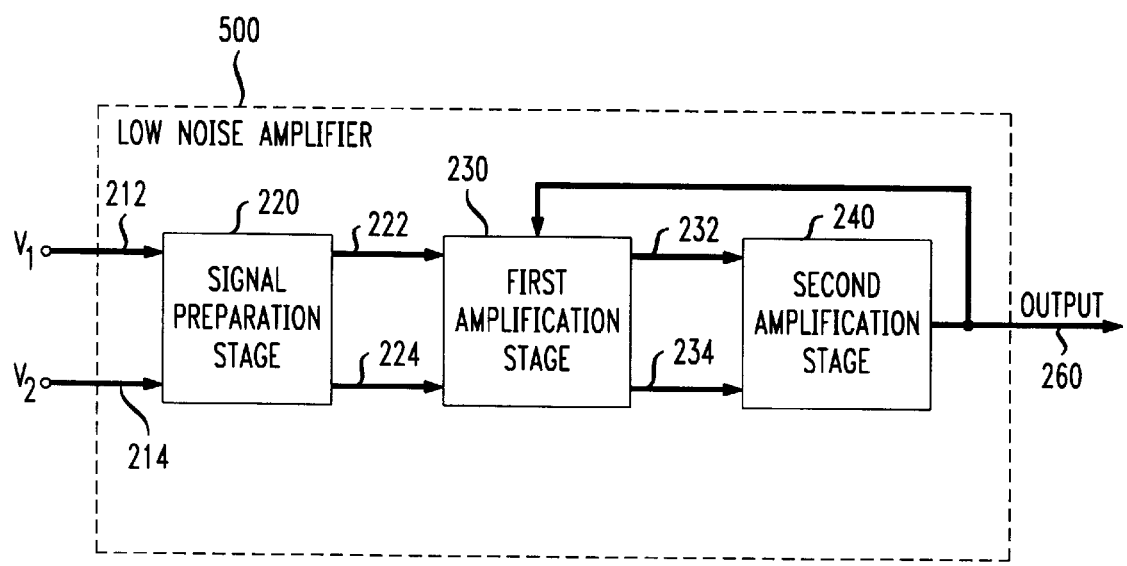
FIG. 2 depicts a block diagram of the illustrative embodiment of the present invention.

FIG. 2 depicts a block diagram of the illustrative embodiment of the present invention, which advantageously comprises a differential input and an output whose voltage is proportional, with respect to ground, to the voltage between the input terminals. The illustrative embodiment advantageously comprises three stages: signal preparation stage 220, first amplification stage 230, and second amplification stage 240, interconnected as shown.

Figure 3:
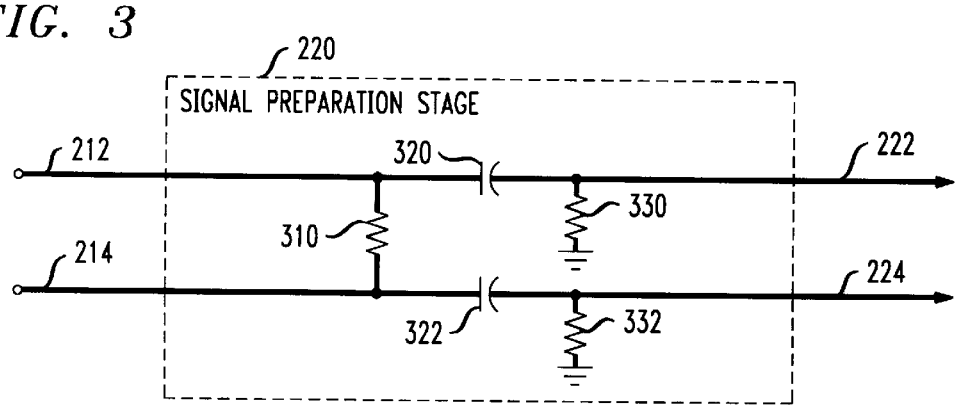
FIG. 3 depicts a schematic diagram of the signal preparation stage of the illustrative embodiment.

FIG. 3 depicts a schematic diagram of signal preparation stage 220, which is advantageously used when low-noise amplifier 200 is used to amplify an electric current. In such cases, leads 212 and 214 are electrically connected in series with the current that is to be amplified. Alternatively, when low-noise amplifier 200 is used to amplify a voltage across a device, signal preparation stage 220 is advantageously omitted from low-noise amplifier 200 and leads 222 and 224 are advantageously connected across the voltage to be amplified.

Signal preparation stage 220 advantageously comprises: resistor 310, capacitor 320, capacitor 322, resistor 330 and resistor 332, interconnected as shown. Resistor 310 is advantageously a low-noise resistor, such as a wire-wound resistor, with a resistance that matches resistance of the first amplification stage 230 in well-known fashion. Capacitor 320 and resistor 330 are used as a high-pass filter and to provide noise immunity on lead 212. Analogously, capacitor 322 and resistor 332 are used as a high-pass filter and to provide noise immunity on lead 214. Advantageously, signal preparation stage 220 is advantageously co-located with first amplification stage 230 and second amplification stage 240 so as to improve the noise immunity of low-noise amplifier 200. It will be clear to those skilled in the art how to make and use signal preparation stage 220.

Figure 4:
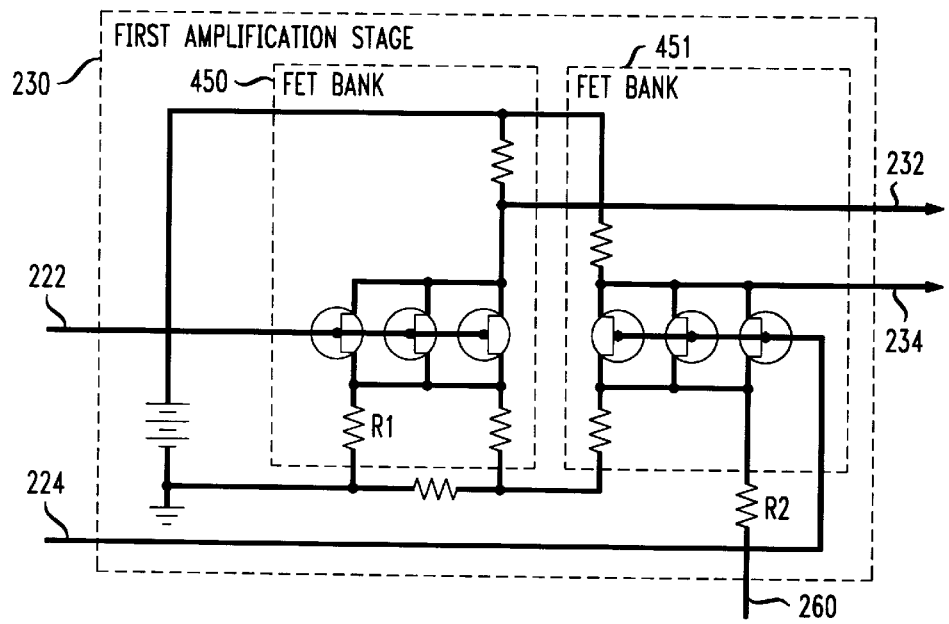
FIG. 4 depicts a schematic diagram of the first amplification stage of the illustrative embodiment.

FIG. 4 depicts a schematic diagram of first amplification stage 230, in accordance with the illustrative embodiment of the present invention. First amplifier stage 230 is advantageously a differential amplifier stage, which promotes noise immunity and common mode rejection for low-noise amplifier 200. To provide even better noise immunity, first amplifier stage 230 is advantageously characterized by opposing banks of ganged or connected in parallel junction field-effect transistors: field-effect transistor bank 450 and field-effect transistor bank 451. Both of field-effect transistor bank 450 and field-effect transistor bank 451 advantageously comprise a plurality of field-effect transistors that are ganged such that each similar lead is electrically connected. For example, all of the drains are electrically connected, all of the sources are electrically connected, and all of the gates are electrically connected (and as shown in FIG. 4). The sources of the field effect transistors in FET bank 450 are advantageously connected through a resistor, $R_1$, to ground, and the sources of the field effect transistors in FET bank 451 are advantageously connected through a resistor, $R_2$, to output 260 as a feedback mechanism. It will be clear to those skilled in the art that resistors $R_1$ and $R_2$ advantageously have the same resistance and it will be also clear to those skilled in the art how to choose a value for $R_1$ and $R_2$ so as to affect the overall gain of low noise amplifier 500.

Although the noise added to the signal to be amplified increases as the number of field-effect transistors in a bank increases, the gain of first amplification stage 230 increases more quickly than does the noise. As is well-known to those skilled in the art, the total power increases proportionately with the number of field-effect transistors ganged in a bank, but the total noise decreases in proportion to the inverse of the square root of the number of field-effect transistors ganged in a bank.

It will be clear to those skilled in the art that there is also a trade-off between gain and power consumption in first amplification stage 230 as the number of field-effect transistors ganged in a bank varies. To further promote the noise immunity of first amplification stage 230, all of the circuitry in first amplification stage 230 is advantageously powered by a co-located battery rather than by line voltage. Although in FIG. 4, the input signals are connected to the gates of the field-effect transistors, and the outputs are connected to the drains, it will be clear to those skilled in the art how to make and use first amplifier stage 230 in which the field-effect transistors are arranged in other configurations.

Figure 5:
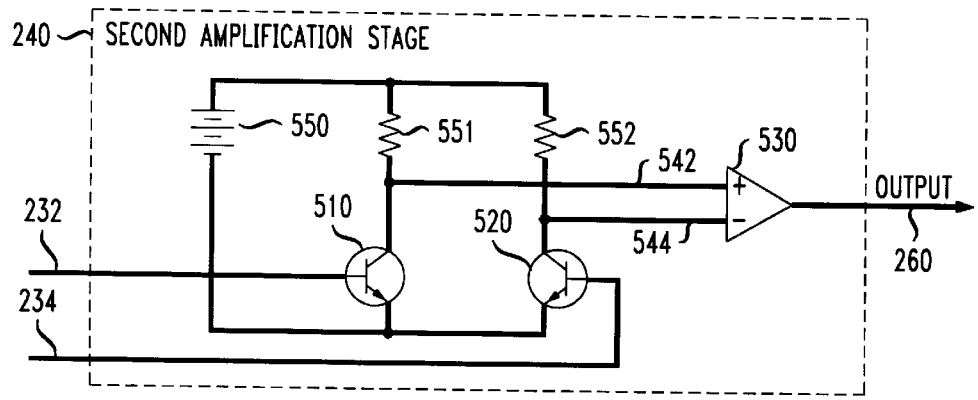
FIG. 5 depicts a schematic diagram of the second amplification stage of the illustrative embodiment.

FIG. 5 depicts a schematic diagram of second amplification stage 240, which advantageously comprises: bipolar junction transistor 510, bipolar junction transistor 520, differential amplifier 530, battery 550, resistor 551, and resistor 552, interconnected as shown. Second amplification stage 240 also advantageously operates as a differential amplifier and each output of first amplification stage 230 is advantageously input to one of the bases of the bipolar junction transistor 510 and bipolar junction transistor 520. The output of bipolar junction transistor 510 is advantageously electrically connected to the non-inverting input of differential amplifier 530 and the output of bipolar junction transistor 520 is advantageously electrically connected to the inverting input, as shown. To reduce the amount of noise emitted into the signal by second amplification stage 240, differential amplifier 530 is advantageously a low-noise device and all of the components in second amplification stage 240 are advantageously powered by a battery, in contrast to line voltage. Both first amplification stage 230 and second amplification stage 240 can be powered by the same battery.

Although bipolar junction transistor 510 and bipolar junction transistor 520 are depicted in common-collector configuration, it will be clear to those skilled in the art how to make and use second amplification stage 240 with the transistors in a different configuration.

It is to be understood that the above-described embodiments are merely illustrative of the invention and that many variations may be devised by those skilled in the art without departing from the scope of the invention. It is therefore intended that such variations be included within the scope of the following claims and their equivalents.

What is claimed is:

1. An apparatus comprising:
   a first field-effect transistor having a first lead, a second lead and a third lead;
   a second field-effect transistor having a first lead, a second lead and a third lead;
   a first bipolar junction transistor having a first lead, a second lead and a third lead, wherein said second lead of said first bipolar junction transistor is electrically connected to said first lead of said first field-effect transistor;
   a resistor having a first lead and a second lead, wherein said first lead of said resistor is electrically connected to said second lead of said first field-effect transistor, and said second lead of said resistor is electrically connected to said second lead of said second field-effect transistor;
   a third field-effect transistor having a first lead, a second lead and a third lead, wherein said first lead of said third field-effect transistor is electrically connected to said first lead of said first field-effect transistor, said second lead of said third field-effect transistor is electrically connected to said second lead of said first field-effect transistor, and said third lead of said third field-effect transistor is electrically connected to said third lad of said third field-effect transistor; and a fourth field-effect transistor having a first lead, a second lead and a third lead, wherein said first lead of said fourth field-effect transistor is electrically connected to said first lead of said second field-effect transistor, said second lead of said fourth field-effect transistor is electrically connected to said second lead of said second field-effect transistor, and said third lead of said fourth field-effect transistor is electrically connected to said third lead of said second field-effect transistor, further comprising: a second bipolar junction transistor having a first lead, a second lead and a third lead, wherein said second lead of said second bipolar junction transistor is electrically connected to said first lead of said second field-effect transistor.

2. The apparatus of claim 1 further comprising: a second bipolar junction transistor having a first lead, a second lead and a third lead, wherein said second lead of said second bipolar junction transistor is electrically connected to said first lead of said second field-effect transistor.

3. The apparatus of claim 2 further comprising an amplifier having an inverting input, a non-inverting input, and an output, wherein said second lead of said first bipolar junction transistor is electrically connected to said non-inverting input of said amplifier, said second lead of said second bipolar junction transistor is electrically connected to said inverting input of said amplifier, and said output of said amplifier is electrically connected to said third lead of said first field-effect transistor.

4. An apparatus comprising:

a first field-effect transistor having a first lead, a second lead, and a third lead;

a first bipolar junction transistor having a first lead, a second lead, and a third lead, wherein said first lead of said first field-effect transistor is electrically connected to said second lead of said first bipolar junction transistor;

a second field-effect transistor having a first lead, a second lead, and a third lead;

a second bipolar junction transistor having a first lead, a second lead, and a third lead, wherein said first lead of said second field-effect transistor is electrically connected to said second lead of said second bipolar junction transistor; and an amplifier having an inverting input, a non-inverting input and an output, wherein said first lead of said first bipolar junction transistor is electrically connected to said non-inverting input, said first lead of said second bipolar junction transistor is electrically connected to said inverting input, and said output of said amplifier is electrically connected to said third lead of said second field-effect transistor.

5. The apparatus of claim 4 further comprising:

a third field-effect transistor having a first lead, a second lead and a third lead, wherein said first lead of said third field-effect transistor is electrically connected to said first lead of said first field-effect transistor, and said second lead of said third field-effect transistor is electrically connected to said second lead of said first field-effect transistor; and a fourth field-effect transistor having a first lead, a second lead and a third lead, wherein said first lead of said fourth field-effect transistor is electrically connected to said first lead of said second field-effect transistor, and said second lead of said fourth field-effect transistor is electrically connected to said second lead of said second field-effect transistor, and said third lead of said fourth field-effect transistor is electrically connected to said third lead of said second field-effect transistor.

6. An apparatus comprising:

a first field-effect transistor having a first lead, a second lead, and a third lead;

a first bipolar junction transistor having a first lead, a second lead, and a third lead, wherein said first lead of said first field-effect transistor is electrically connected to said second lead of said first bipolar junction transistor;

a second field-effect transistor having a first lead, a second lead, and a third lead;

a second bipolar junction transistor having a first lead, a second lead, and a third lead, wherein said first lead of said second field-effect transistor is electrically connected to said second lead of said second bipolar junction transistor; and a resistor having a first lead and a second lead, wherein said first lead of said resistor is electrically connected to said second lead of said first field-effect transistor and said second lead of said resistor is electrically connected to said second lead of said second field-effect transistor.

7. The apparatus of claim 6 further comprising an amplifier having an inverting input, a non-inverting input, and an output, wherein said second lead of said first bipolar junction transistor is electrically connected to said non-inverting input of said amplifier, said second lead of said second bipolar junction transistor is electrically connected to said inverting input of said amplifier, and said output of said amplifier is electrically connected to said third lead of said first field-effect transistor.

* * * * *